United States Patent
Ramkumar et al.

(10) Patent No.: US 9,496,144 B2
(45) Date of Patent: *Nov. 15, 2016

(54) METHOD OF FABRICATING A CHARGE-TRAPPING GATE STACK USING A CMOS PROCESS FLOW

(71) Applicant: Cypress Semiconductor Corporation, San Jose, CA (US)

(72) Inventors: Krishnaswamy Ramkumar, San Jose, CA (US); Hui-Mei Shih, Taiwan (TW)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/675,037

(22) Filed: Mar. 31, 2015

(65) Prior Publication Data

US 2016/0005610 A1    Jan. 7, 2016

Related U.S. Application Data

(63) Continuation of application No. 14/490,514, filed on Sep. 18, 2014, now Pat. No. 8,993,457.

(60) Provisional application No. 61/936,549, filed on Feb. 6, 2014.

(51) Int. Cl.
  *H01L 21/00* (2006.01)
  *H01L 21/28* (2006.01)
  (Continued)

(52) U.S. Cl.
  CPC ..... *H01L 21/28282* (2013.01); *H01L 21/0223* (2013.01); *H01L 21/02244* (2013.01); *H01L 21/28194* (2013.01); *H01L 21/8234* (2013.01); *H01L 27/11568* (2013.01); *H01L 27/11573* (2013.01); *H01L 29/4234* (2013.01);
  (Continued)

(58) Field of Classification Search
  CPC ............ H01L 21/8234; H01L 21/02244; H01L 21/02252; H01L 29/518; H01L 29/7856; H01L 27/092; H01L 21/28282; H01L 29/4234; H01L 29/513
  USPC .................. 438/197, 763; 257/369
  See application file for complete search history.

(56) References Cited

U.S. PATENT DOCUMENTS

| 4,570,331 A | 2/1986 | Eaton et al. |
| 5,293,336 A * | 3/1994 | Ishii ............... H01L 21/8234 257/E21.616 |

(Continued)

OTHER PUBLICATIONS

International Search Report for application No. PCT/US15/14118 dated Feb. 19, 2015; 3 pages.

(Continued)

*Primary Examiner* — Nathan W Ha

(57) ABSTRACT

A method of fabricating a memory device is described. Generally, the method includes: forming on a surface of a substrate a dielectric stack including a tunneling dielectric and a charge-trapping layer overlying the tunneling dielectric; depositing a first cap layer comprising an oxide over the dielectric stack; forming a second cap layer comprising a nitride over the first cap layer; patterning the first and second cap layers and the dielectric stack to form a gate stack of a memory device; removing the second cap layer; and performing an oxidation process to form a blocking oxide over the charge-trapping layer, wherein the oxidation process consumes the first cap layer. Other embodiments are also described.

20 Claims, 15 Drawing Sheets

(51) Int. Cl.
  *H01L 21/02* (2006.01)
  *H01L 21/8234* (2006.01)
  *H01L 29/66* (2006.01)
  *H01L 29/792* (2006.01)
  *H01L 27/115* (2006.01)
  *H01L 29/423* (2006.01)
  *H01L 29/51* (2006.01)

(52) U.S. Cl.
  CPC .......... *H01L29/511* (2013.01); *H01L 29/518* (2013.01); *H01L 29/66833* (2013.01); *H01L 29/792* (2013.01); *H01L 21/02252* (2013.01)

(56) References Cited

U.S. PATENT DOCUMENTS

| | | | |
|---|---|---|---|
| 5,883,010 A * | 3/1999 | Merrill | H01L 21/28518 257/E21.165 |
| 5,942,450 A * | 8/1999 | Song | H01L 21/8234 257/E21.616 |
| 6,063,706 A * | 5/2000 | Wu | H01L 21/8234 257/E21.165 |
| 6,677,255 B1 | 1/2004 | Shih et al. | |
| 6,689,653 B1 | 2/2004 | Seah et al. | |
| 6,946,349 B1 | 9/2005 | Lee et al. | |
| 7,033,890 B2 | 4/2006 | Shone | |
| 7,183,166 B2 | 2/2007 | Wang et al. | |
| 8,273,664 B2 | 9/2012 | Cheng et al. | |
| 8,501,609 B2 | 8/2013 | Roizin et al. | |
| 2003/0232507 A1 | 12/2003 | Chen | |
| 2005/0282330 A1* | 12/2005 | Mears | B82Y 10/00 438/222 |
| 2006/0019454 A1* | 1/2006 | Mears | B82Y 10/00 438/289 |
| 2006/0027808 A1* | 2/2006 | Bedell | H01L 21/02381 257/65 |
| 2007/0205446 A1 | 9/2007 | Dong et al. | |
| 2011/0215404 A1 | 9/2011 | Zhu et al. | |
| 2014/0264720 A1 | 9/2014 | Lee et al. | |

OTHER PUBLICATIONS

USPTO Notice of Allowance for U.S. Appl. No. 14/490,514 dated Feb. 5, 2015; 7 pages.
Written Opinion of the International Searching Authority for application No. PCT/US15/14118 dated Feb. 19, 2015; 3 pages.

* cited by examiner

| Blocking Oxide 330 |
| T_SiN 318b |
| B_SiN 318a |
| TUNOX 316 |
| Substrate 306 |

FIG. 3C

| 1ST nitride CAP 322a | ← 322b |
| T_SiN 318b |
| B_SiN 318a |
| TUNOX 316 |
| Substrate 306 |

| SACOX 324 |
| 2ND nitride CAP 322b | ⎫ 322 |
| 1ST nitride CAP 322a | ⎭ |
| T_SiN 318b | ⎫ 318 |
| B_SiN 318a | ⎭ |
| TUNOX 316 |
| Substrate 306 |

FIG. 3A

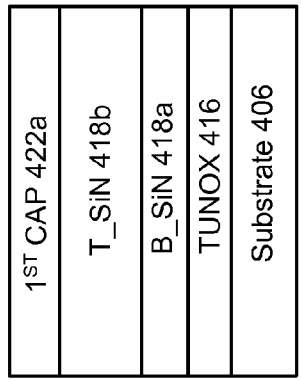
FIG. 4C
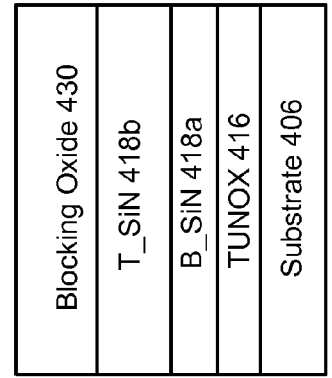
FIG. 4F
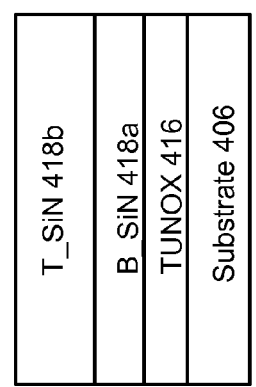
FIG. 4B
FIG. 4E
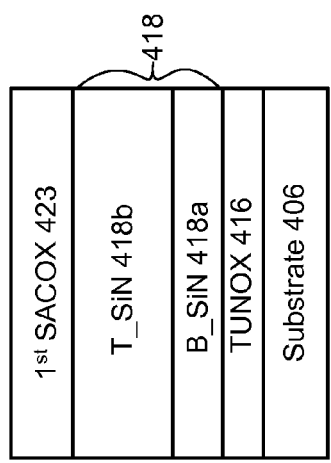
FIG. 4A
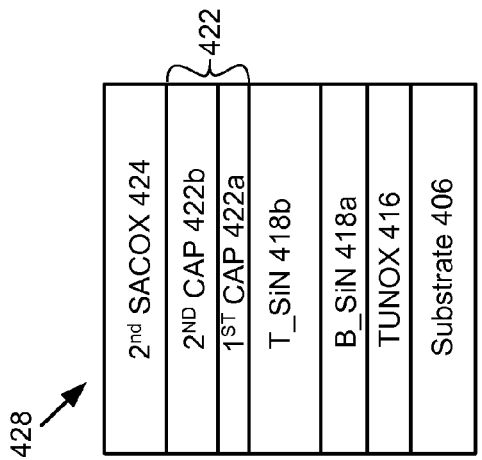
FIG. 4D

METHOD OF FABRICATING A CHARGE-TRAPPING GATE STACK USING A CMOS PROCESS FLOW

CROSS-REFERENCE TO RELATED APPLICATIONS

This application is a continuation of U.S. patent application Ser. No. 14/490,514, filed Sep. 18, 2014, now U.S. Pat. No. 8,993,457, issued Mar. 31, 2015, which claims priority to U.S. Provisional Patent Application No. 61/936,549, filed Feb. 6, 2014, all of which are incorporated by reference herein in their entirety.

TECHNICAL FIELD

The present disclosure relates generally to the field of semiconductor devices, and more particularly to methods of integrating a charge-trapping gate stack into a CMOS flow.

BACKGROUND

While Integrated circuits including logic devices and interface circuits based upon metal-oxide-semiconductor field-effect transistors (MOSFETs) are typically fabricated using a standard complimentary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOSFETs will function properly. For many applications it is desirable to include non-volatile memory devices based upon FETs including charge-trapping gate stacks in the integrated circuit. Charge-trapping gate stack formation involves the formation of a nitride or oxynitride charge-trapping layer sandwiched between two dielectric or oxide layers typically referred to as an ONO stack. Conventional technologies for fabricating ONO stacks use materials and processes that differ significantly from those of the standard CMOS process flow, and which can detrimentally impact or be impacted by the fabrication of the MOSFETs. In particular, forming a gate-oxide or dielectric of a MOSFET can significantly degrade performance of a previously formed ONO stack by altering a thickness or composition of the top oxide or blocking oxide.

SUMMARY

Methods of fabricating a circuit including a memory device and a logic device are described. In one embodiment, the method includes forming on a surface of a substrate a dielectric stack including a tunneling dielectric and a charge-trapping layer overlying the tunneling dielectric. A first cap layer comprising an oxide is deposited over the dielectric stack, and a second cap layer comprising a nitride formed over the first cap layer. The first and second cap layers and the dielectric stack are patterned to form a gate stack of a memory device. The second cap layer is removed, and an oxidation process performed to form a blocking oxide over the charge-trapping layer, in which the oxidation process consumes the first cap layer.

BRIEF DESCRIPTION OF THE DRAWINGS

Embodiments of the present invention will be understood more fully from the detailed description that follows and from the accompanying drawings and the appended claims provided below, where:

FIGS. 3A-3C are block diagrams illustrating cross-sectional views of a portion of the IC during fabrication thereof according to the method of FIG. 1 in which the first cap layer includes nitride;

FIGS. 4A-4F are block diagrams illustrating another embodiment of a method of fabricating an IC including a MOSFET and a NVM device with a charge-trapping gate stack in which a first cap layer includes a grown oxide;

DETAILED DESCRIPTION

The present disclosure is directed generally to a method of integrating a memory device including a charge-trapping gate stack into a CMOS process flow.

In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "above," "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

Figure 1:
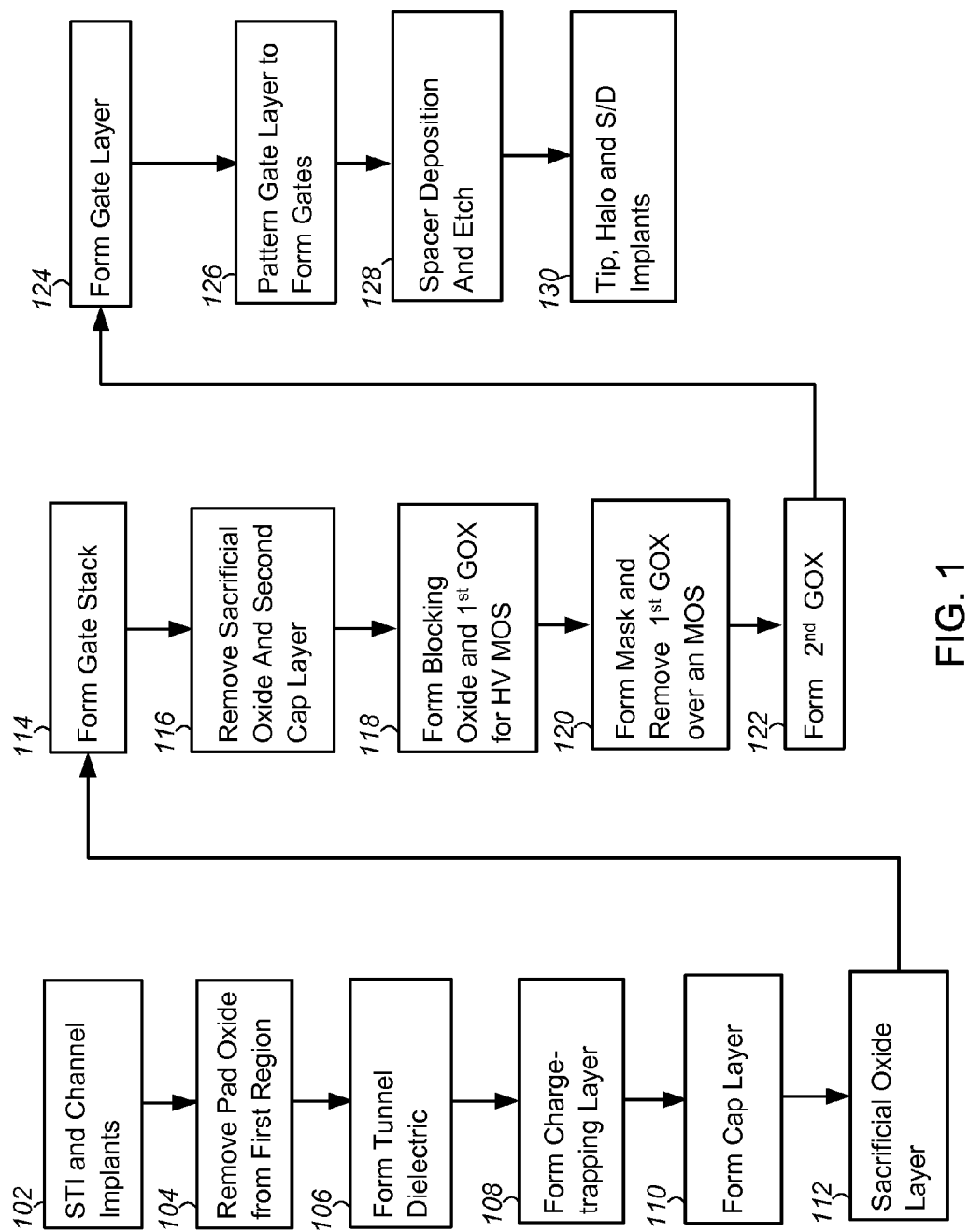
FIG. 1 is a flowchart illustrating an embodiment of a method of fabricating an integrated circuit (IC) including metal-oxide-semiconductor field-effect transistors (MOSFETs) and a non-volatile memory (NVM) device with a charge-trapping gate stack.
Figure 2A:
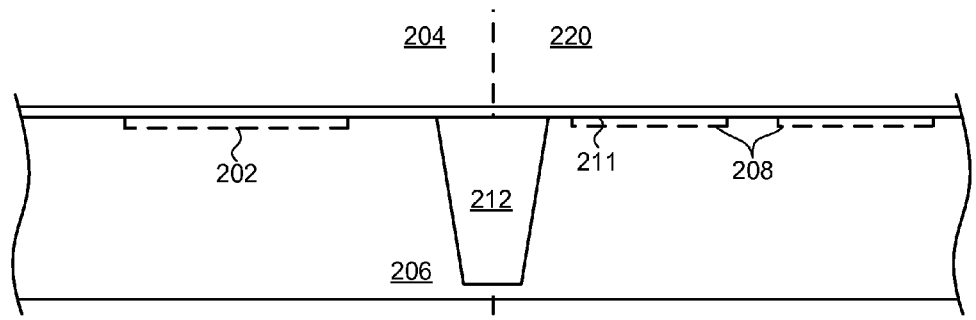
FIGS. 2A-2Q are block diagrams illustrating cross-sectional views of a portion of the IC during fabrication thereof according to the method of FIG. 1 in which a first cap layer includes a deposited oxide.

An embodiment of a method for integrating a circuit including a metal-oxide-semiconductor field-effect transistor (MOSFET) and a non-volatile memory device including a charge-trapping gate stack will now be described in detail with reference to FIGS. 1 and 2A through 2Q. FIG. 1 is a flowchart illustrating an embodiment of a method of fabricating an integrated circuit (IC) including metal-oxide-semiconductor field-effect transistors (MOSFETs) and a non-volatile memory (NVM) device with a charge-trapping gate stack. FIGS. 2A-2Q are block diagrams illustrating cross-sectional views of a portion of the IC during fabrication thereof according to the method of FIG. 1.

Referring to FIGS. 1 and 2A, the process begins with forming a channel 202 for a memory device in a first region 204 of a substrate 206 and channels 208 for one or more MOS devices in a second region 210 of the substrate (step 102). The substrate 206 may be a bulk wafer composed of any single crystal material suitable for semiconductor device fabrication, or may include a top epitaxial layer of a suitable material formed on a substrate. Suitable materials include, but are not limited to, silicon, germanium, silicon-germanium or an III-V compound semiconductor material.

Generally, the channels 202, 208, are formed by implantation of appropriate ion species through a pad oxide 211 in both the first region 204 and the second region 210. For example, $BF_2$ can be implanted at an energy of from about 5 to about 100 kilo-electron volts (keV), and a dose of from about 1e14 $cm^{-2}$ to about 1e16 $cm^{-2}$ to form an N-type non-volatile memory device. A P-type device may likewise be formed by implantation of Arsenic or Phosphorous ions at any suitable dose and energy. It is to be appreciated that implantation can be used to form channels 202, 208, in both regions of the substrate 206 at the same time, or at separate times using standard lithographic techniques, including a patterned photoresist layer to mask one of the regions. The pad oxide 211 is silicon dioxide ($SiO_2$) having a thickness of from about 10 nanometers (nm) to about 20 nm and can be grown by a thermal oxidation process or in-situ steam generation (ISSG).

In some embodiments, such as that shown, isolation structures 212 may be formed in the substrate 206 to electrically isolate a memory device formed in the first region 204 from a MOS device formed in the second region 210. Isolation structures 212 are formed prior to forming the pad oxide 211 and channels 202, 208, and may be formed by any conventional technique, such as, but not limited to shallow trench isolation (STI) or local oxidation of silicon (LOCOS).

Figure 2B:
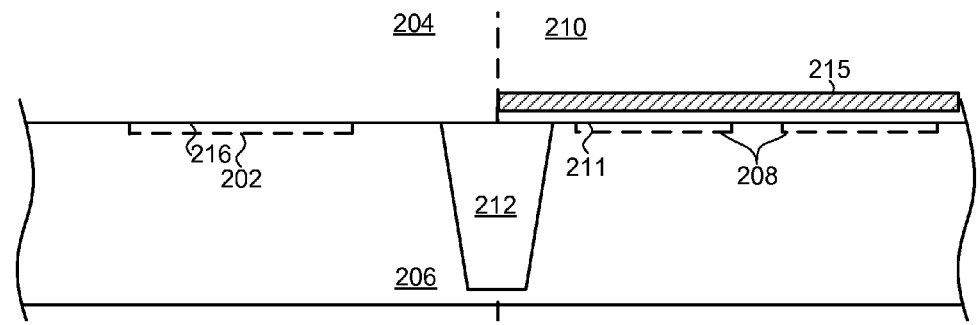

Next, referring to FIGS. 1 and 2B a patterned mask layer 215 is formed on or overlying the pad oxide 211 and the pad oxide etched or patterned to remove the oxide from the first region 204 of the substrate 206 (step 104). The patterned mask layer 215 can include a photoresist layer patterned using standard lithographic techniques, and the pad oxide 211 can be etched or removed using a wet or dry etch process to stop on a surface of the substrate 206. In one exemplary embodiment, the pad oxide 211 is removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 2C:
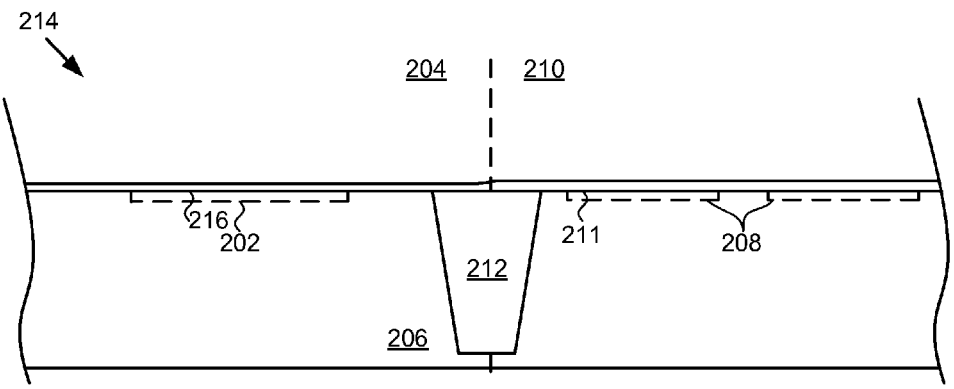

Referring to FIGS. 1 and 2C, a dielectric stack 214 is formed, beginning with the formation of a tunnel dielectric 216 over at least the channel 202 of the memory device in the first region 204 of the substrate 206 (step 106). The tunnel dielectric 216 may be any material and have any thickness suitable to allow charge carriers to tunnel into the charge trapping layer under an applied gate bias while maintaining a suitable barrier to leakage when the memory device is unbiased. In certain embodiments, tunnel dielectric 216 is silicon dioxide, silicon oxy-nitride, or a combination thereof and can be grown by a thermal oxidation process, in-situ steam generation (ISSG), or radical oxidation.

For example, in one embodiment a silicon dioxide tunnel dielectric 216 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of ~900-1000° C. at a pressure approximately in the range of 0.5-5 Torr to form radicals, such as, an OH radical, an $HO_2$ radical or an O diradical, at the surface of substrate. The radical oxidation process is carried out for a duration approximately in the range of 1-10 minutes to effect growth of a tunnel dielectric 216 having a thickness of from about 1.5 nanometers (nm) to about 3.0 nm by oxidation and consumption of the exposed surface of substrate. It will be understood that in this and in subsequent figures the thickness of tunnel dielectric 216 is exaggerated relative to the pad oxide 211, which is approximately 7 times thicker, for the purposes of clarity. A tunnel dielectric 216 grown in a radical oxidation process is both denser and is composed of substantially fewer hydrogen atoms/$cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 216 without impacting the throughput (wafers/hr.) requirements that a fabrication facility may require.

In another embodiment, tunnel dielectric layer 216 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel dielectric 216 is a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Figure 2D:
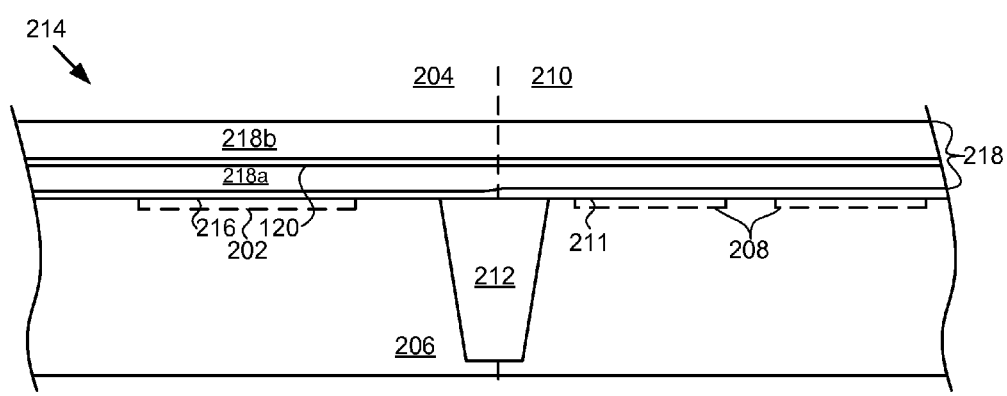

Referring to FIGS. 1 and 2D, a charge-trapping layer 218 is formed on or overlying the tunnel dielectric 216 (step 108). Generally, as in the embodiment shown, the charge-trapping layer 218 is a multi-layer charge-trapping layer including at least a lower or first charge-trapping layer 218a closer to the tunnel dielectric 216, and an second charge-trapping layer 218b that is oxygen-lean relative to the first charge-trapping layer and includes a majority of a charge traps distributed in multi-layer charge-trapping layer.

The first charge-trapping layer 218a of a multi-layer charge-trapping layer 218 can include a silicon nitride ($Si_3N_4$), silicon-rich silicon nitride or a silicon oxy-nitride ($SiO_xN_y$ ($H_z$)). For example, the first charge-trapping layer 218a can include a silicon oxynitride layer having a thickness of between 2.0 nm and 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 218b of the multi-layer charge-trapping layer 218 is then formed over the first charge-trapping layer 218a. The second charge-trapping layer 218b can include a silicon nitride and silicon oxy-nitride layer having a stoichiometric composition of oxygen, nitrogen and/or silicon different from that of the first charge-trapping layer 218a. The second charge-trapping layer 218b can include a silicon oxynitride layer having a thickness of between 2.0 nm and 5.0 nm, and may be formed or deposited by a CVD process using a process gas including DCS/$NH_3$ and $N_2O/NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen-rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

In some embodiments, the multi-layer charge-trapping layer 218 is a split charge-trapping layer, further including a thin, middle oxide layer 220 separating the first charge-trapping layer 218a and the second charge-trapping layer 218b. The middle oxide layer 220 substantially reduces the probability of electron charge that accumulates at the boundaries of the second charge-trapping layer 218b during programming from tunneling into the first charge-trapping layer 218a, resulting in lower leakage current than for the conventional memory devices.

In one embodiment, the middle oxide layer 220 is formed by oxidizing to a chosen depth using thermal or radical oxidation. Radical oxidation may be performed, for example, at a temperature of 1000-1100° C. using a single wafer tool, or 800-900° C. using a batch reactor tool. A mixture of $H_2$ and $O_2$ gasses may be introduced to a process chamber at a ratio of approximately 1:1 and a pressure of 300-500 Torr for a batch process, or 10-15 Torr using a single vapor tool, for a time of 1-2 minutes using a single wafer tool, or 30 min to 1 hour using a batch process. In some embodiments, the radical oxidation process is without an ignition event, such as forming of plasma, which would otherwise typically be used to pyrolyze the $H_2$ and $O_2$ to form steam. Instead, the $H_2$ and $O_2$ are permitted to react at a surface of the first charge-trapping layer 218a to form radicals, such as, an OH radical, an $HO_2$ radical or an O diradical, to form the middle oxide layer 220.

Figure 2E:
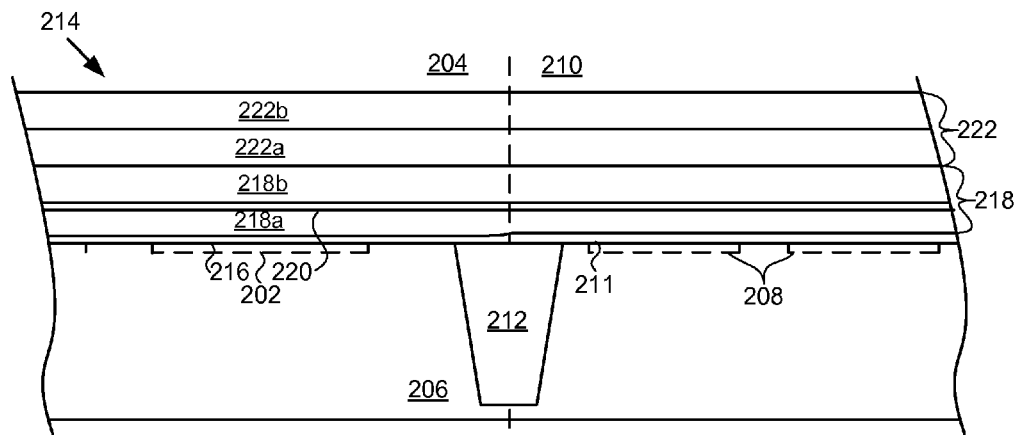

Referring to FIGS. 1 and 2E, a cap layer 222 is formed on or overlying the dielectric stack 214 or the charge-trapping layer 218 (step 110). In some embodiments, such as that shown, the cap layer 222 is a multi-layer cap layer including at least a lower or first cap layer 222a overlying the charge-trapping layer 218, and a second cap layer 222b overlying the first cap layer 222a.

In one embodiment, the first cap layer 222a can include a high-temperature-oxide (HTO), such as silicon oxide ($SiO_2$), having a thickness of between 2.0 nm and 4.0 nm deposited using a low pressure chemical vapor deposition (LPCVD) process. For example, the LPCVD process can include exposing the substrate 206 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 900° C. to about 1000° C. In some embodiments, the LPCVD process is performed in-situ in the same process chamber as used to form the second charge-trapping layer 218b, and immediately following the formation of the second charge-trapping layer 218b. In one embodiment, the first cap layer 222a may be grown by an ISSG oxidation process out of a top portion of the second charge-trapping layer 218b. Compared to the HTO layer deposited by an LPCVD process, the first cap layer 222a can be relatively thin at approximately 1.0 to 1.5 nm. HTO layer, on the other hand, may need to be 1.5-2.0 nm to get a continuous layer. In addition, the first cap layer 222a grown by ISSG oxidation of a top portion of the second charge-trapping layer 218b is a relatively high quality oxide.

The second cap layer 222b can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures.

Figure 2F:
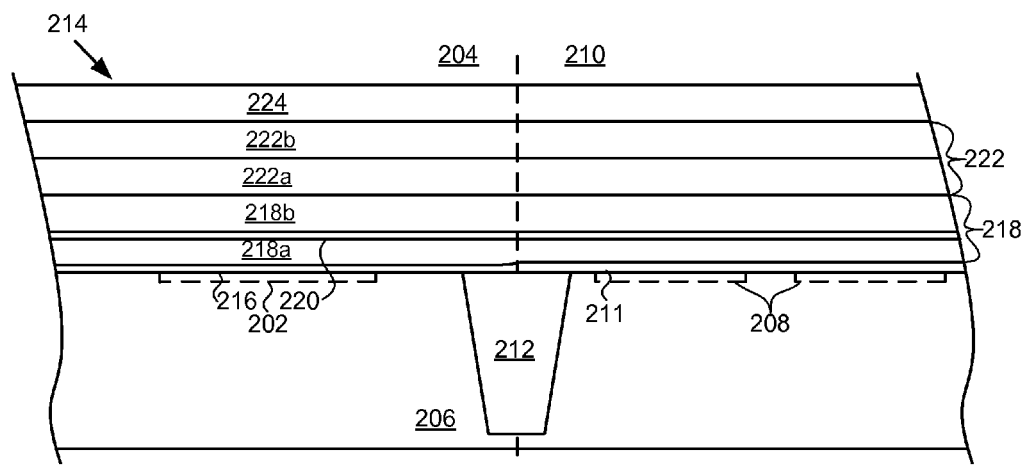

Referring to FIGS. 1 and 2F, a sacrificial oxide layer 224 is formed on or overlying the cap layer 222 (step 112). In one embodiment, the sacrificial oxide layer 224 can include a high-temperature-oxide (HTO) layer grown by a thermal oxidation process or radical oxidation, and having a thickness of between 2.0 nm and 4.0 nm. In another embodiment, the sacrificial oxide layer 224 can be formed or deposited by a chemical vapor deposition process in a low pressure chemical vapor deposition (LPCVD) chamber. For example, the sacrificial oxide layer 224 can be deposited by a CVD process using a process gas including gas mixtures of silane or DCS and an oxygen containing gas, such as $O_2$ or $N_2O$, in ratios and at flow rates tailored to provide a silicon dioxide ($SiO_2$) sacrificial oxide layer.

Figure 2G:
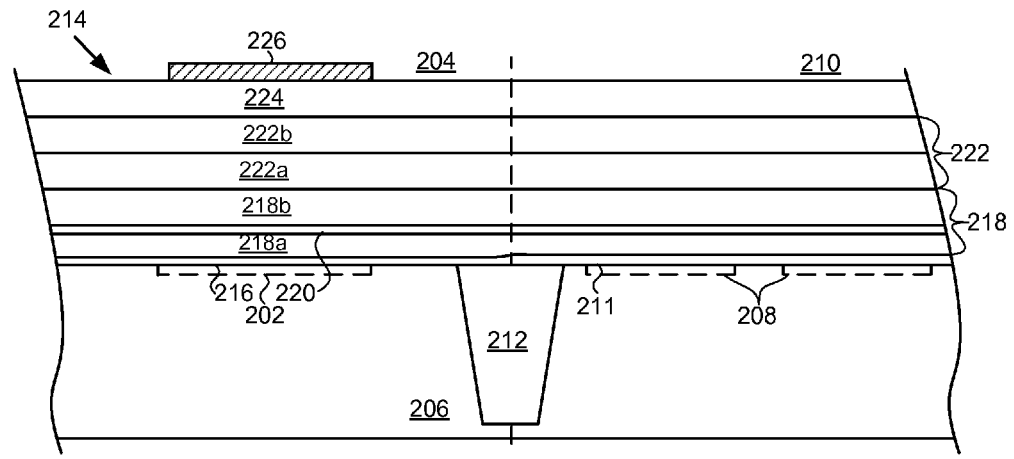
Figure 2H:
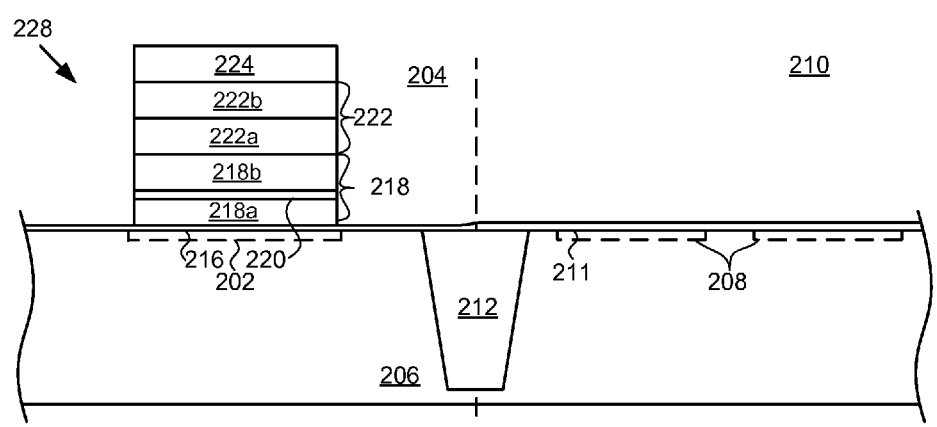
Figure 2:
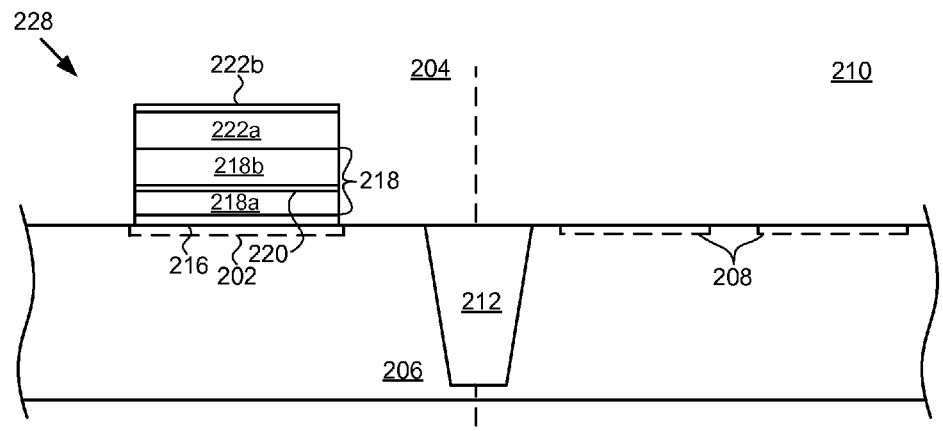

Next, referring to FIGS. 1 and 2G, a patterned mask layer 226 is formed on or overlying the sacrificial oxide layer 224, and, referring to FIG. 2H, the sacrificial oxide layer, cap layer 222 and the dielectric stack 214 etched or patterned to form a gate stack 228 overlying the channel 202 of the memory device and to remove the sacrificial oxide layer, cap layer and the dielectric stack from the second region 210 of the substrate 206 (step 114). The patterned mask layer 226 can include a photoresist layer patterned using standard lithographic techniques, and the sacrificial oxide layer 224, cap layer 222 and dielectric stack 214 can be etched or removed using a the dry etch process including one or more separate steps to stop on a surface of the tunnel dielectric 216 and the pad oxide 211.

Referring to FIGS. 1 and 2I, the sacrificial oxide layer 224 and a portion or substantially of all of a top most or second cap layer 222b in a multi-layer, cap layer 222 are removed from the gate stack 228 in a highly selective cleaning process (step 116). This cleaning process further removes any oxide, such as an oxide tunnel dielectric 216 and pad oxide 211, remaining in the first region 204 outside the gate stack 228 and in the second region 210 to prepare the substrate 206 in that region for gate-oxide growth. In one exemplary implementation the sacrificial oxide layer 224 and the second cap layer 222b are removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 2J:
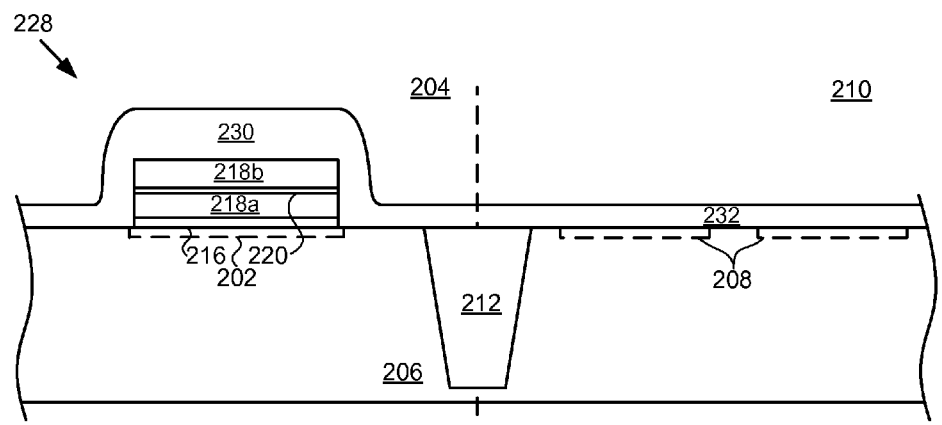

Next, referring to FIGS. 1 and 2J, an oxidation process is performed to oxidize the remaining portion of the cap layer 222 or the first cap layer 222a of a multi-layer, cap layer, and, optionally, a portion of the second charge-trapping layer 218b to form a blocking oxide layer 230 overlying the second charge-trapping layer. In one embodiment, the oxidation process is adapted to oxidize the first cap layer 222a to form the blocking oxide layer 230 while simultaneously oxidizing at least a portion of a surface of the substrate 206 in the second region 210 to form a first gate-oxide 232 overlying at least the channel 208 of at least one MOS device (step 118). The oxidation process can include in-situ-steam-generation (ISSG), CVD, or radical oxidation performed in a batch or single substrate processing chamber with or without an ignition event such as plasma. For example, in one embodiment the blocking oxide layer 230 and the gate-oxide 232 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C. at a pressure approximately in the range of 0.5-5 Torr to form radicals, such as, an OH radical, an $HO_2$ radical or an O diradical radicals at a surface of the cap layer 222 or the first cap layer 222a. The radical oxidation process is carried out for a duration approximately in the range of 10-15 minutes to effect growth of a blocking oxide layer 230 by oxidation and consumption of the first cap layer 222a and a portion of the second charge-trapping layer 218b having a thickness of from about 3 nm to about 4.5 nm, and gate-oxide 232 having a thickness of from about 5 nm to about 7 nm.

Figure 2K:
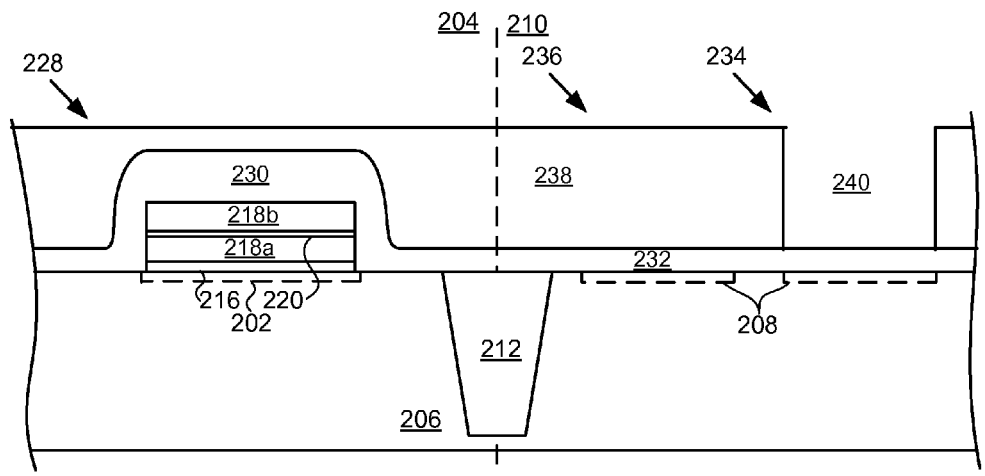
Figure 2L:
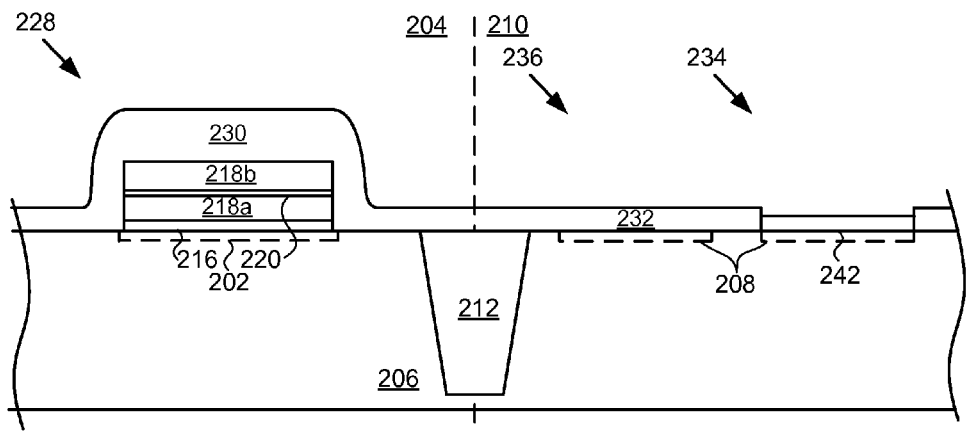
Figure 2M:
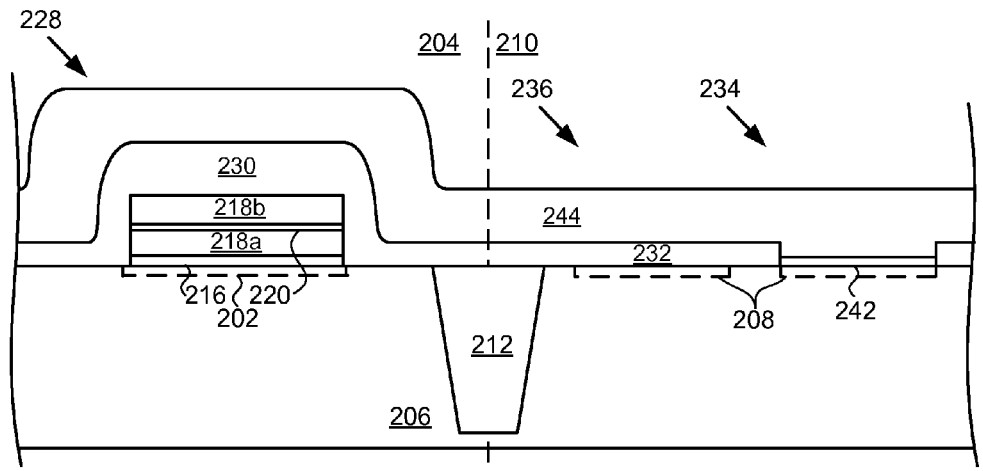
Figure 2N:
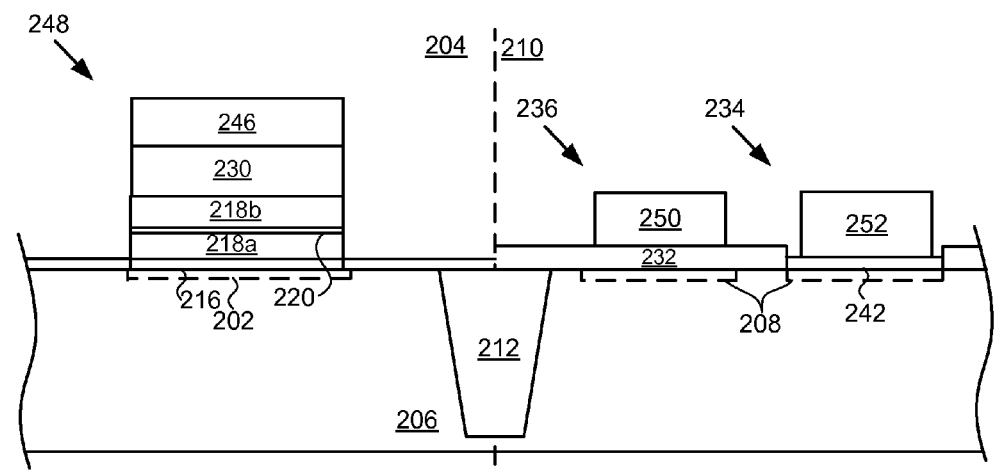
Figure 2O:
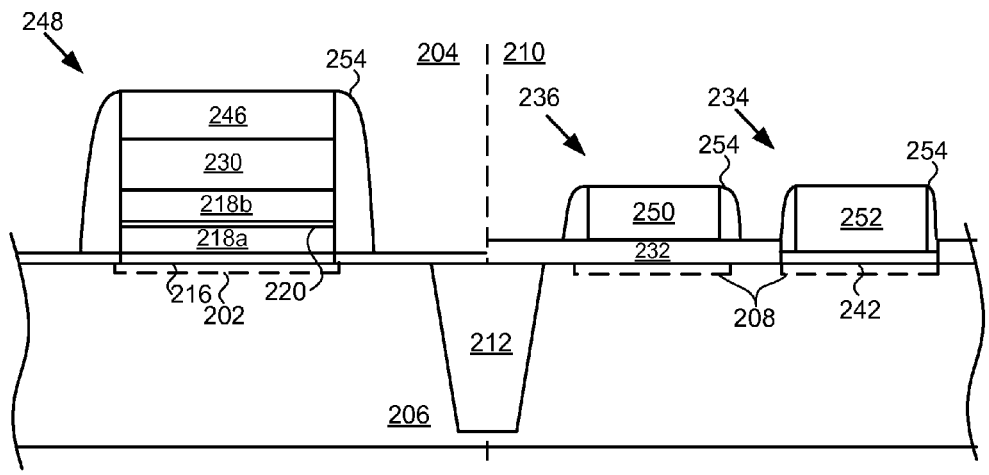
Figure 2P:
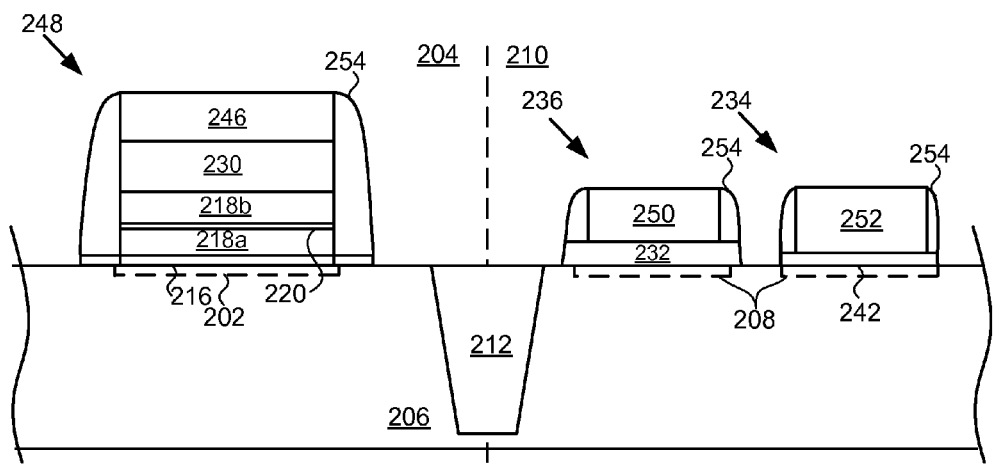
Figure 2Q:
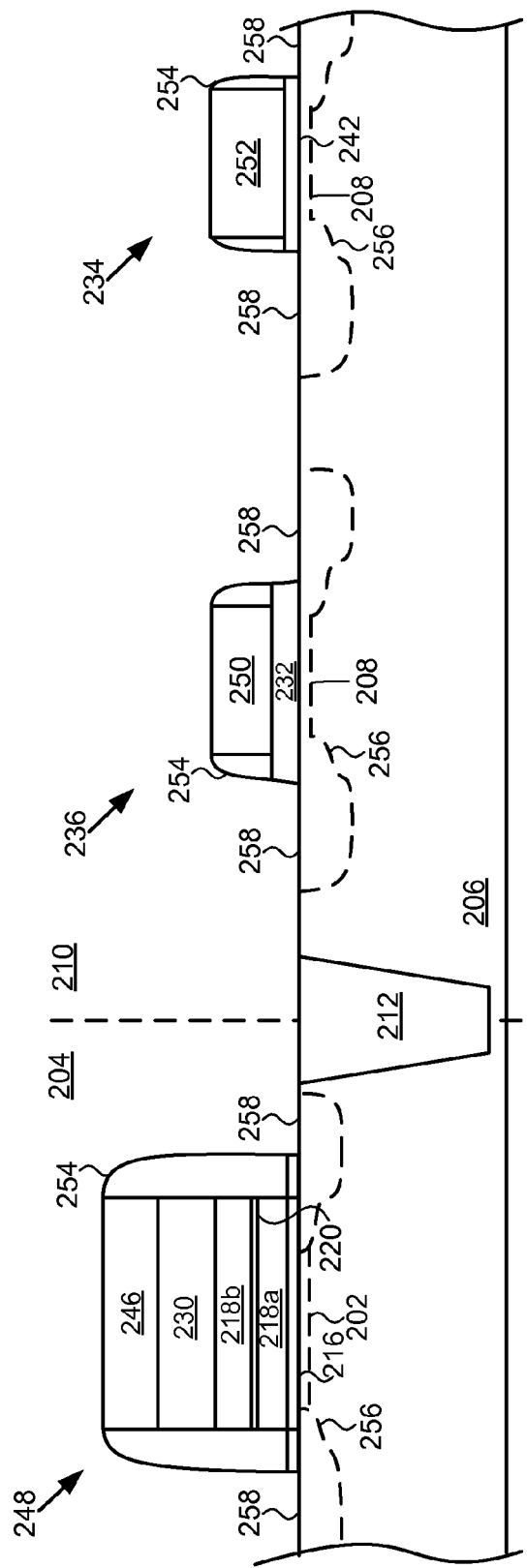

In some embodiments, such as that shown in FIGS. 2k to 2Q, the method further includes a dual gate-oxide process flow to enable fabrication of both a MOS device 234 and a HV MOS device 236. Referring to FIGS. 1 and 2K, a patterned mask layer 238 is formed over the first and second regions 204, 210 of the substrate 206 (step 120). The patterned mask layer 238 can be a photoresist layer patterned using standard lithographic techniques, and includes at least one opening 240 over a channel 208 in the second region 210. The thick, first gate-oxide 232 is etched in the exposed regions by using a BOE etch, under conditions similar to those described above with respect to removing the sacrificial oxide layer 224, and the patterned mask layer 238 is then removed.

Referring to FIGS. 1 and 2L, the substrate 206 is cleaned using a wet etch that does not etch oxide in order to protect the first gate-oxide 232 of the HV MOS device 236, and the blocking oxide layer 230 of the gate stack 228 and the first gate-oxide 232 (step 122). The substrate 206 is then subjected to a thermal oxidation process to grow a thin, second gate-oxide 242 having a thickness from about 1.5 nm to about 3 nm.

In some embodiments a thin a high dielectric constant or high-k dielectric material can be used in place of the silicon dioxide. The high-k dielectric material may include, but is not limited to, hafnium oxide, zirconium oxide, hafnium silicate, hafnium oxy-nitride, hafnium zirconium oxide and lanthanum oxide deposited by, for example, atomic layer deposition (ALD), physical vapor deposition (PVD), a chemical vapor deposition (CVD), a low pressure CVD (LPCVD) or a plasma enhanced CVD (PECVD) process.

Referring to FIGS. 1 and 2M, a gate layer 244 of any conducting or semiconducting material suitable for accommodating a biasing of the memory device and operation of the MOS device is formed over the gate stack 228, the first gate-oxide 232 of the HV MOS device 236, and the second gate-oxide 242 of the MOS device 234 (step 124). In one embodiment, the gate layer is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer is formed by a CVD process and is composed of doped poly-crystalline silicon.

Referring to FIGS. 1 and 2N, the gate layer 244 is patterned using a mask layer (not shown) and standard lithographic techniques to stop on surfaces of the blocking oxide layer 230, the first gate-oxide 232 and the second gate-oxide 242, thereby forming a gate 246 for the gate stack 228 of a memory device 248, a gate 250 for the HV MOS device 236, and a gate 252 for the MOS device 234 (step 126).

Referring to FIGS. 1 and 2O-2P, sidewall spacers 254 formed adjacent to the gates 246, 250, 252, for all devices, and remaining exposed portions of the blocking oxide layer 230, the first gate-oxide 232 and the second gate-oxide 242, anisotropically etched to yield the structure shown in FIG. 2P with substantially complete memory device 248, HV MOS device 236 and MOS device 234 (step 128).

Referring to FIGS. 1 and 2Q, with the gate stack of the memory device 248, HV MOS device 236 and MOS device 234 substantially complete, tip and/or HALO implants may be performed to form extension regions 256, source and drain implants performed to form source and drain regions 258 for all devices (step 130).

In other embodiments, the cap layer can include a single or multiple layers of silicon nitride or silicon oxynitride The cap layer 322 can be a single layer of silicon nitride or silicon oxynitride having a homogeneous composition, a single layer of silicon nitride or silicon oxynitride having a gradient in stoichiometric composition, or, as in the embodiment shown, can be a multi-layer, cap layer including at least a lower or first cap layer 322a including nitride overlying the charge-trapping layer 318, and a nitride second cap layer 322b overlying the first cap layer 322a.

Referring to FIG. 3A, a method of fabricating integrated circuit (IC) including a MOSFET and a non-NVM device using a multi-layer, cap layer 322 begins with forming a tunnel dielectric 316, and a charge-trapping layer 318 over a surface of a substrate 306. The tunnel dielectric 316, charge-trapping layer 318 and substrate 306 have compositions and/or can be formed as described above with respect to FIGS. 1 and 2A through 2D. Generally, as in the embodiment shown, the charge-trapping layer 318 is a multi-layer charge-trapping layer including at least a lower or first charge-trapping layer 318a closer to the tunnel dielectric 316, and an second charge-trapping layer 318b that is oxygen-lean relative to the first charge-trapping layer and includes a majority of a charge traps distributed in multi-layer charge-trapping layer. Optionally, the charge-trapping layer 318 can be a split charge-trapping layer, further including a thin, middle oxide layer (not shown in this figure) separating the first charge-trapping layer 318a and the second charge-trapping layer 318b as described above with respect to FIG. 2D.

The first cap layer 322a can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Similarly, the second cap layer 322b can also include a silicon nitride, a silicon-rich silicon nitride or a silicon-rich silicon oxynitride layer having a thickness of between 1.5 nm and 4.0 nm formed by a CVD process using $N_2O/NH_3$ and $DCS/NH_3$ gas mixtures. Optionally, the first cap layer 322a and second cap layer 322b can include different stoichiometries. For example, the first cap layer 322a can have a silicon or oxygen-rich composition, for example, the first cap layer can include an oxygen-rich-nitride or oxynitride having substantially the same stoichiometric composition as the first charge-trapping layer 318a to facilitate subsequent oxidation of the first cap layer. substantially the same stoichiometric composition Similarly, the second cap layer 322b can also include a silicon nitride, a silicon-rich nitride or a silicon-rich oxynitride layer having a thickness of between 1.5 nm and 4.0 nm formed by a CVD process using $N_2O/NH_3$ and $DCS/NH_3$ gas mixtures. Optionally, the second cap layer 322b can have substantially the same stoichiometric composition as the second charge-trapping layer 318b, that is oxygen lean relative to the first cap layer 322a.

Next, a sacrificial oxide layer 324 is formed on or overlying the dielectric the cap layer 322. The sacrificial oxide layer 324 can have a composition substantially identical to the composition of the sacrificial oxide layer 224, and can be formed as described above with respect to that layer.

Next, the sacrificial oxide layer 324, charge-trapping layer 318 and cap layer 322 are patterned as described above with respect to FIGS. 2G through 2H to form a gate stack 328 in a first or NVM region of the substrate 306, and to remove said layers from a second or MOS region (not shown in this figure).

Referring to FIG. 3B, the sacrificial oxide 324 and a portion or substantially of the entire top most or second cap layer 322b are removed from the gate stack 328 in a highly selective cleaning process. This cleaning process can be substantially identical to the GOX preclean described above with respect to FIG. 2I.

Referring to FIG. 3C, an oxidation process is performed to oxidize the remaining portion of the cap layer 322 or the first cap layer 322a of a multi-layer cap layer, and, optionally, a portion of the second charge-trapping layer 318b to form a blocking oxide layer 330 overlying the second charge-trapping layer. The oxidation process can be substantially identical to that described above with respect to FIG. 2J. In some embodiments the oxidation process is used to concurrently form at least one gate-oxide for a MOS device or transistor in a second region of the substrate (not shown in this figure).

The process flow is continued substantially as described above with respect to FIGS. 2H through 2Q to complete fabrication of the NVM and MOS devices or transistors.

In yet other embodiments, described with respect to FIGS. 4A-4F, the first cap layer of a multi-layer, cap layer includes a silicon oxide grown, not deposited, using a wet thermal oxidation process or in-situ steam generation (ISSG) process.

Referring to FIG. 4A, the method begins with forming a tunnel dielectric 416, and a charge-trapping layer 418 including a first charge-trapping layer 418a and a second charge-trapping layer 418b over a surface of a substrate 406. The tunnel dielectric 416, charge-trapping layer 418 and substrate 406 have compositions and/or can be formed as described above with respect to FIGS. 1 and 2A through 2D. Next, a first sacrificial oxide layer 423 is formed on or overlying the second charge-trapping layer 418b. The sacrificial oxide layer 423 can have a composition substantially identical to the composition of the sacrificial oxide layers 224 and 324 and can be formed as described above with respect to those layers.

Next, referring to FIG. 4B a first sacrificial oxide layer 423 is removed in a clean process substantially identical to the GOX Preclean described above with respect to FIGS. 2I and 3B. As with those cleaning processes the clean process to remove the first sacrificial oxide layer 423 can also remove a portion of the underlying second charge-trapping layer 418b.

Next, referring to FIG. 4C a first cap layer 422a is formed on or overlying the second charge-trapping layer 418b using a wet thermal oxidation process ISSG process. Generally, the ISSG process is performed or carried out in an ISSG chamber using water at temperatures of at least about 1000° C.

Next, referring to FIG. AD the substrate is returned to the tool used to form the tunnel dielectric 416 and charge-trapping layer 418 of the initial dielectric stack, and a second cap layer 422b is formed on or overlying the first cap layer 422a. Generally, the second cap layer 422b can have a composition substantially identical to the composition of the second cap layer 222b and 322b described above, and can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. A second sacrificial oxide layer 424 is formed on or overlying the second cap layer 222b. Generally, the sacrificial oxide layer 424 has a thickness of between 2.0 nm and 4.0 nm, and a composition substantially identical to the composition of the sacrificial oxide layers 224, 324 and 423 can be formed as described above with respect to those layers. The sacrificial oxide layer 424, cap layer 422, the tunnel dielectric 416 and the charge-trapping layer 418 are etched or patterned to form a gate stack 428 overlying the channel 402 of the memory device and to remove the sacrificial oxide layer, cap layer and the dielectric stack from a second region of the substrate (not shown in this figure).

Referring to FIG. 4E, the sacrificial oxide layer 424 and a portion or substantially of the entire top most or second cap layer 422b are removed from the gate stack 428 in a highly selective cleaning process. This cleaning process can be substantially identical to the GOX Preclean described above with respect to FIG. 2I.

Finally, referring to FIG. 4F, an oxidation process is performed to oxidize the remaining portion of the cap layer 422 or the first cap layer 422a of a multi-layer, cap layer, and, optionally, a portion of the second charge-trapping layer 418b to form a blocking oxide layer 430 overlying the second charge-trapping layer. The oxidation process can be substantially identical to that described above with respect to FIG. 2J. In some embodiments the oxidation process is used to concurrently form at least one gate-oxide for a MOS device or transistor in a second region of the substrate (not shown in this figure).

The process flow is continued substantially as described above with respect to FIGS. 2H through 2Q to complete fabrication of the NVM and MOS devices or transistors.

In another alternate embodiment, an IC including a MOSFET and a NVM device with a charge-trapping gate stack are fabricated using a cluster tool with separate deposition chambers for growing an oxide first cap layer and depositing nitride or oxynitride. Suitable single-wafer cluster tools include, for example, the Centura™ platform commercially available from Applied Materials, Inc., located in Santa Clara, Calif.

Figure 5:
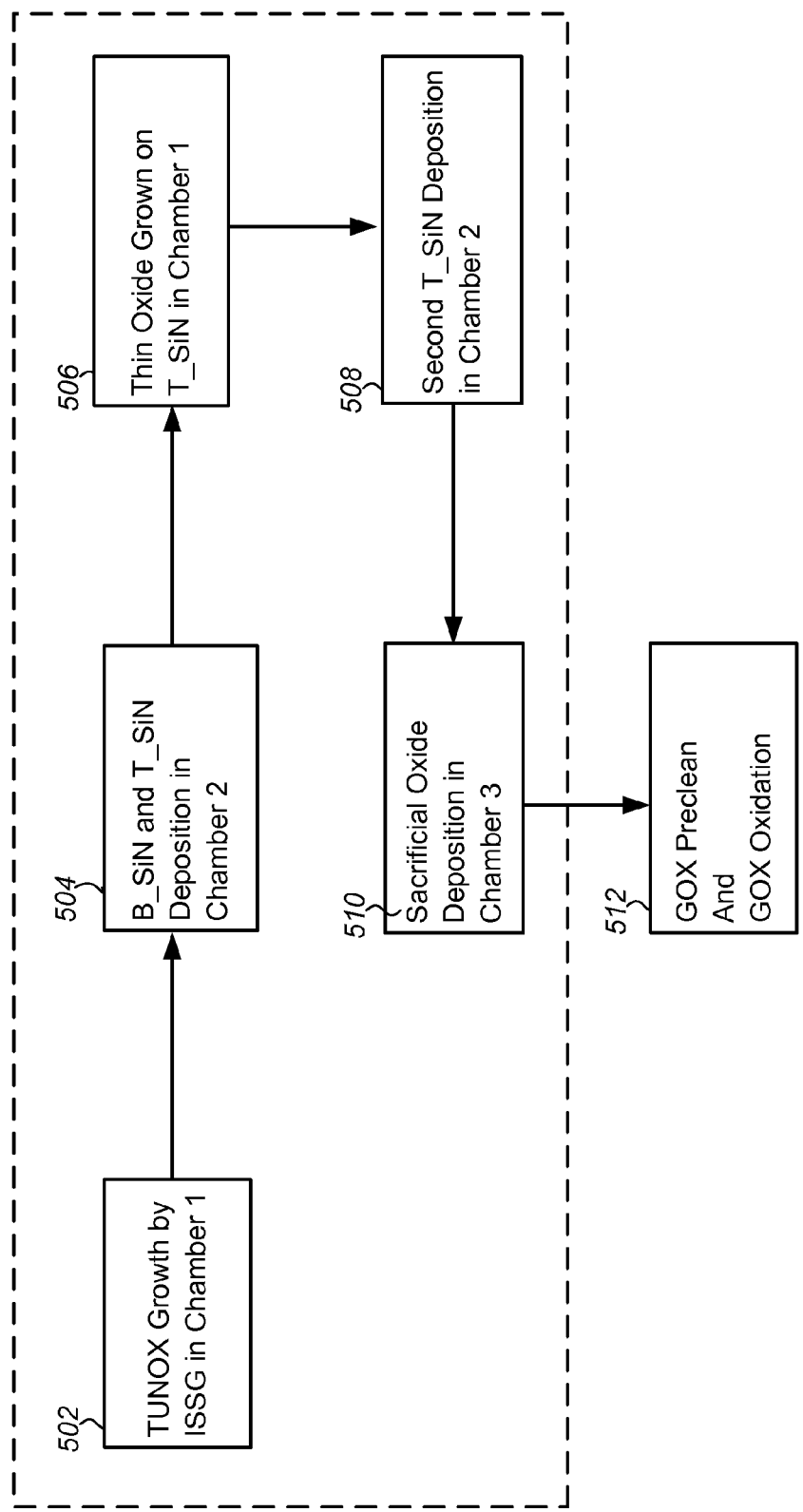
FIG. 5 is a flowchart illustrating another embodiment of a method of fabricating an IC including a MOSFET and a NVM device with a charge-trapping gate stack using a cluster tool with separate deposition chambers for growing an oxide first cap layer and depositing nitride or oxynitride.

Referring to the flowchart of FIG. 5 the method begins with growing a tunnel oxide layer (TUNOX) by ISSG in a first chamber (Chamber 1) of the cluster tool (step 502). Next, the substrate is transferred to a second chamber (Chamber 2) of the cluster tool and the bottom (B_SiN) and top (T_SiN) silicon nitride layers of a multi-layer charge trapping layer deposited (step 504). The composition and processes used to deposit the bottom and top layers are substantially identical to those described above with respect to FIGS. 1 and 2A through 2D. Next, the substrate is returned to the first chamber (Chamber 1) of the cluster tool and a thin oxide that will serve as the first layer of a multi-layer, cap layer is grown on the top (T_SiN) layer (step 506). The composition and processes used to grow the thin oxide are substantially identical to the wet thermal oxidation process or ISSG process described above with respect to first cap layer 422*a*. The substrate is returned to the second chamber (Chamber 2) of the cluster tool and a second silicon nitride layer (Second T_SiN) that will serve as the second layer of a multi-layer cap layer is grown on top of the thin oxide first cap layer (step 508). In the final step performed using the cluster tool, the substrate is transferred to a third chamber (Chamber 3) of the cluster tool and a sacrificial oxide layer deposited over the second silicon nitride layer (step 510). The composition and processes used to deposit the sacrificial oxide layer are substantially identical to the dry thermal oxidation process as described above with respect to sacrificial oxide layer 224. The substrate is then removed from the cluster tool, a clean performed to remove the sacrificial oxide layer and all or substantially all of the second silicon nitride layer, and an oxidation process performed to oxidize the thin oxide or first cap layer and a portion of the underlying top charge-trapping layer to form a blocking oxide on the charge-trapping layer (step 512).

The process flow is continued substantially as described above with respect to FIGS. 2H through 2Q to complete fabrication of the NVM and MOS devices or transistors.

In another aspect the present disclosure is directed to multigate or multigate-surface memory devices including charge-trapping regions overlying two or more sides of a channel formed on or above a surface of a substrate, and methods of fabricating the same. A non-planar multigate device generally includes a horizontal or vertical channel formed on or above a surface of a substrate and surrounded on three or more sides by a gate.

Figure 6A:
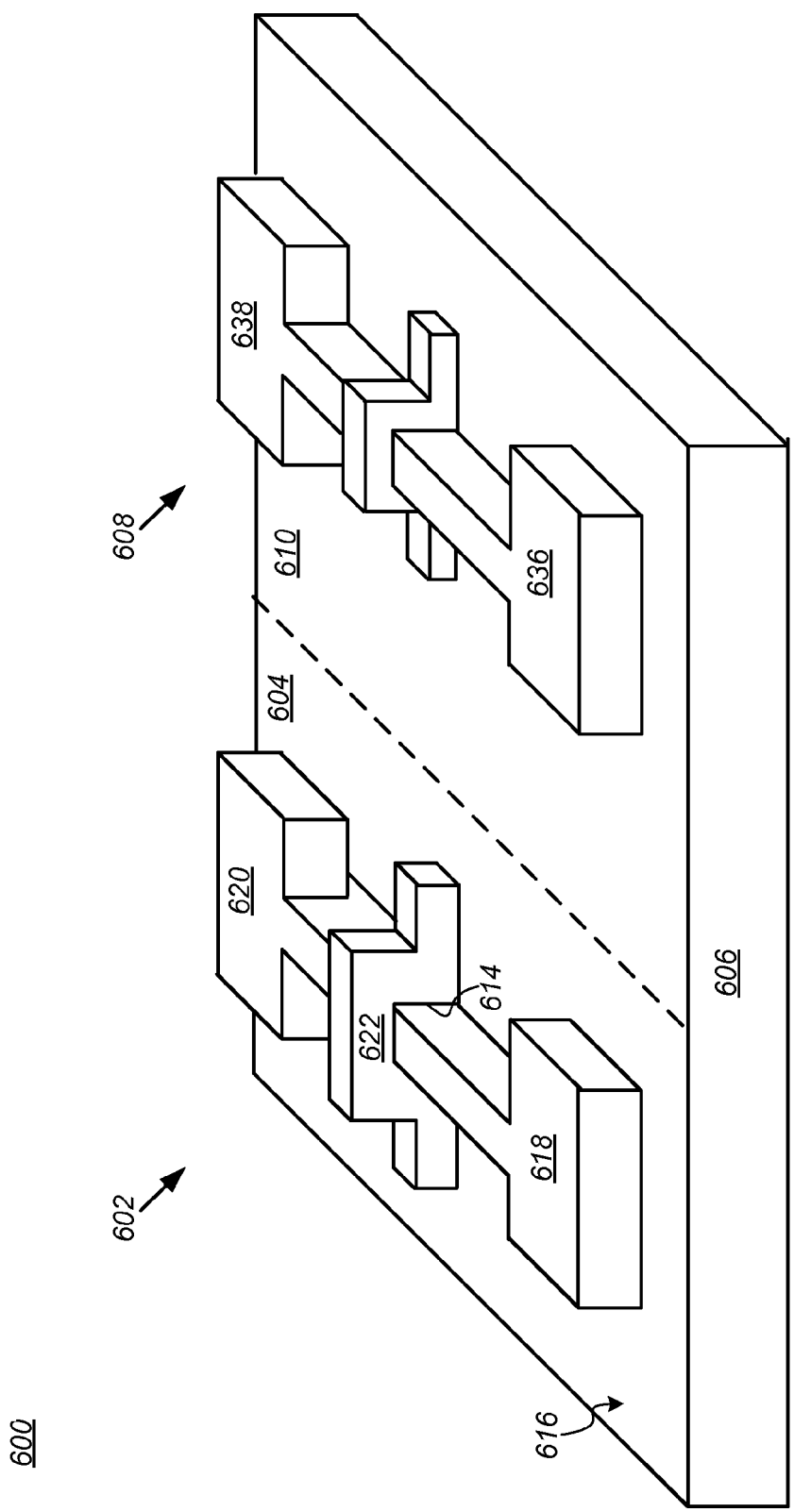
FIGS. 6A and 6B are block diagrams illustrating an IC including a MOSFET and a non-planar, multi-gate NVM device fabricated according to one of the embodiments of the present disclosure.

FIG. 6A illustrates one embodiment of an integrated circuit 600 including a non-planar multigate memory device 602 formed above a first region 604 of a substrate 606, and a MOS device 608 integrally formed adjacent thereto in a second region 610.

Referring to FIG. 6A, the memory device 602, commonly referred to as a finFET, includes a channel 614 formed from a thin film or layer of semiconducting material overlying a surface 616 on the substrate 606 connecting a source 618 and a drain 620 of the memory device. The channel 614 is enclosed on three sides by a fin which forms a gate stack 622 of the device. The thickness of the gate stack 622 (measured in the direction from source to drain) determines the effective channel length of the device.

Figure 6B:
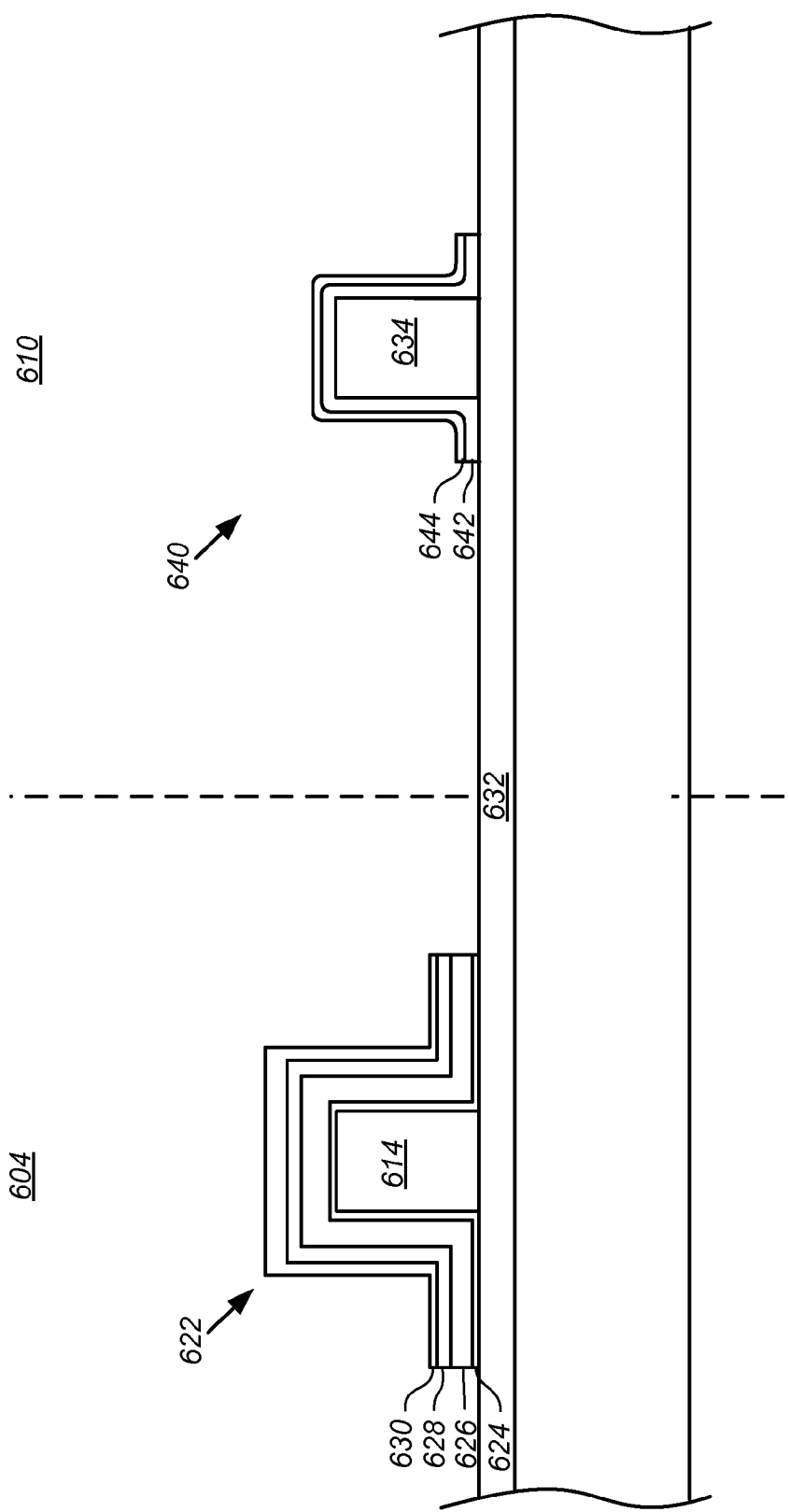

In accordance with the present disclosure, the non-planar multigate memory device 602 of FIG. 6A can include a multi-layer charge-trapping layer and a blocking oxide layer formed by oxidation and consumption of a cap layer and a portion of the charge-trapping layer. FIG. 6B is a cross-sectional view of a portion of the non-planar memory device of FIG. 6A including a portion of the substrate 606, channel 614 and the gate stack 622. The gate stack 622 includes a tunnel dielectric 624 overlying the raised channel 614, a charge-trapping layer 626, a blocking oxide layer 628 and a gate layer 630 overlying the blocking layer to form a control gate of the memory device 602. As described above, the gate layer 630 can include a doped polysilicon or a metal layer.

The channel 614 and gate stack 622 can be formed directly on substrate 606 or on an insulating or dielectric layer 632, such as a buried oxide layer, formed on or over the substrate.

Although not shown in these figures, it will be understood the charge-trapping layer 626 can be multi-layer charge-trapping layer including at least one lower or first charge-trapping layer including nitride closer to the tunnel dielectric 624, and an upper or second charge-trapping layer overlying the first charge-trapping layer. Generally, the second charge-trapping layer includes a silicon-rich, oxygen-lean nitride layer and includes a majority of a charge traps distributed in multiple charge-trapping layers, while the first charge-trapping layer includes an oxygen-rich nitride or silicon oxynitride, and is oxygen-rich relative to the top charge-trapping layer to reduce the number of charge traps therein. By oxygen-rich it is meant wherein a concentration of oxygen in the first charge-trapping layer is from about 15 to about 40%, whereas a concentration of oxygen in second charge-trapping layer is less than about 5%. In some embodiments, the multi-layer charge-trapping layer further includes at least one thin, intermediate or middle oxide layer separating the second charge-trapping layer from the first charge-trapping layer.

Finally, the blocking oxide layer 628 can include an oxide formed by oxidation and consumption of a cap layer and a portion of the charge-trapping layer 626, as described above with reference to FIGS. 2A-2Q.

In the embodiment shown in FIG. 6A, the MOS device 608 is also a finFET, and includes a channel 634 formed from a thin film or layer of semiconducting material overlying the surface 616 of the substrate 606 connecting a source 636 and a drain 638 of the MOS device. The channel 634 is also enclosed on three sides by a fin or gate which forms a gate 640 of the MOS device 608. Referring to FIG. 6B gate 640 of the MOS device 608 includes a gate-oxide 642 overlying the raised channel 634 and a metal or doped polysilicon gate layer 644 overlying the gate-oxide.

Thus, embodiments of integrated circuit including a MOSFET and a non-volatile memory device including a charge-trapping gate stack and methods of forming the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method, comprising:
   forming a dielectric stack on a substrate, the dielectric stack including a tunneling dielectric over the substrate and a charge-trapping layer over the tunneling dielectric;
   forming a first cap layer comprising an oxide over the dielectric stack by performing a first oxidation process of at least a top layer of the charge-trapping layer;
   forming a second cap layer comprising a nitride over the first cap layer;
   patterning the first and second cap layers and the dielectric stack to form a gate stack of a memory device in a first region of the substrate;
   removing at least a portion of the second cap layer; and
   performing a second oxidation process to form a blocking oxide over the charge-trapping layer.

2. The method of claim 1, wherein the second oxidation process consumes a remaining portion of the second cap layer and the first cap layer.

3. The method of claim 1, wherein the blocking oxide is formed by oxidizing the nitride of the second cap layer and densifying the oxide of the first cap layer, and wherein a thickness of the blocking oxide is based on a thickness of the first cap layer.

4. The method of claim 2, wherein the second oxidation process consumes a top layer of the charge-trapping layer.

5. The method of claim 1, wherein the performing the second oxidation process comprises concurrently forming a gate oxide of at least one logic device in a second region of the substrate.

6. The method of claim 5, wherein:
   the blocking oxide of the memory device includes a thickness in a range of 3.0 nm-4.5 nm; and
   the gate oxide of the at least one logic device includes a thickness in a range of 5.0 nm-7.0 nm.

7. The method of claim 1, wherein the charge-trapping layer comprises:
   a first nitride layer formed closer to the tunneling dielectric that is oxygen-rich;
   a second nitride layer formed over the first nitride layer that is oxygen-lean relative to the first nitride layer, wherein the second nitride layer comprises a majority of a charge traps distributed in the charge-trapping layer; and
   a thin middle oxide layer formed between the first nitride layer and the second nitride layer, separating the first and the second nitride layers.

8. A method, comprising:
   forming a dielectric stack on a substrate, the dielectric stack including a tunneling dielectric over the substrate and a charge-trapping layer over the tunneling dielectric;
   forming a first cap layer over the charge-trapping layer;
   forming a second cap layer over the first cap layer;
   patterning the first and second cap layers and the dielectric stack to form a gate stack of a memory device in a first region of the substrate;
   removing at least a portion of the second cap layer; and
   performing an oxidation process to form a blocking oxide over the charge-trapping layer, wherein the oxidation process consumes a remaining portion of the second cap layer and the first cap layer.

9. The method of claim 8, wherein the performing the oxidation process comprises concurrently forming a gate oxide of at least one logic device in a second region of the substrate.

10. The method of claim 9, wherein:
    the blocking oxide of the memory device includes a thickness in a range of 3.0 nm-4.5 nm; and
    the gate oxide of the at least one logic device includes a thickness in a range of 5.0 nm-7.0 nm.

11. The method of claim 8, wherein the forming the first cap layer comprises depositing a high-temperature-oxide (HTO) using a low pressure chemical vapor deposition (LPCVD) thermal oxidation process.

12. The method of claim 8, wherein the forming the first cap layer comprises performing an in-situ-steam-generation (ISSG) oxidation process of at least a top layer of the charge-trapping layer.

13. The method of claim 8, wherein the first cap layer comprises an oxygen-rich-nitride and the second cap layer comprises a nitride.

14. The method of claim 8, further comprising:
    varying a thickness of the blocking oxide by configuring a thickness of the first cap layer.

15. The method of claim 8, wherein the charge-trapping layer comprises a multi-layer charge-trapping layer including:
    a first nitride layer formed closer to the tunneling dielectric that is oxygen-rich;
    a second nitride layer formed over the first nitride layer that is oxygen-lean relative to the first nitride layer, wherein the second nitride layer comprises a majority of a charge traps distributed in the charge-trapping layer; and
    a thin middle oxide layer formed between the first nitride layer and the second nitride layer, separating the first and the second nitride layers to reduce charge leakage.

16. The method of claim 15, wherein the first cap layer and the first nitride layer of the multi-layer charge-trapping layer comprise stoichiometric compositions that are substantially the same.

17. A method, comprising:
    forming a dielectric stack on a substrate, the dielectric stack including a tunneling dielectric over the substrate and a charge-trapping layer over the tunneling dielectric;
    forming a first sacrificial oxide layer over the charge-trapping layer;
    removing at least the first sacrificial oxide layer;
    forming a first cap layer comprising an oxide over the dielectric stack, wherein the oxide is formed using a wet thermal oxidation process of a top portion of the charge-trapping layer;
    forming a second cap layer comprising a nitride over the first cap layer;
    forming a second sacrificial oxide layer over the second cap layer;
    patterning the second sacrificial oxide layer, the first and second cap layers and the dielectric stack to form a gate stack of a memory device in a first region of the substrate;
    removing the second sacrificial oxide layer and at least a portion of the second cap layer; and
    performing an oxidation process to form a blocking oxide over the charge-trapping layer, wherein the oxidation process consumes a remaining portion of the second cap layer and the first cap layer.

18. The method of claim 17, wherein the performing the oxidation process comprises concurrently forming a gate oxide of at least one logic device in a second region of the substrate.

19. The method of claim 18, wherein
a thickness of the blocking oxide is based on a thickness of the first cap layer;
the blocking oxide of the memory device includes a thickness in a range of 3.0 nm-4.5 nm; and
the gate oxide of the at least one logic device includes a thickness in a range of 5.0 nm-7.0 nm.

20. The method of claim 17, wherein the removing the at least the first sacrificial oxide layer includes removing a portion of the charge-trapping layer.

* * * * *